(12) United States Patent
Khazen et al.

(10) Patent No.: US 10,916,877 B1
(45) Date of Patent: Feb. 9, 2021

(54) QSFP-DD CONNECTOR BACKSHELL WITH VERTICALLY ARRANGED ROWS OF CABLES

(71) Applicant: Mellanox Technologies, Ltd., Yokneam (IL)

(72) Inventors: Nimer Khazen, Baena (IL); Jamal Mousa, Haifa (IL); Dor Oz, Tel Aviv (IL); David Fischer, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/688,145

(22) Filed: Nov. 19, 2019

(51) Int. Cl.
| | |
|---|---|
| *H01R 13/646* | (2011.01) |
| *H01R 13/50* | (2006.01) |
| *H01R 13/66* | (2006.01) |
| *H01R 43/20* | (2006.01) |
| *H01R 13/56* | (2006.01) |
| *H05K 3/32* | (2006.01) |
| *H01R 24/60* | (2011.01) |
| *H01R 13/6589* | (2011.01) |
| *H05K 1/11* | (2006.01) |
| *H01R 12/53* | (2011.01) |
| *H01R 13/6594* | (2011.01) |

(52) U.S. Cl.
CPC .......... *H01R 13/50* (2013.01); *H01R 13/562* (2013.01); *H01R 13/646* (2013.01); *H01R 13/665* (2013.01); *H01R 43/205* (2013.01); *H01R 12/53* (2013.01); *H01R 13/6589* (2013.01); *H01R 13/6594* (2013.01); *H01R 24/60* (2013.01); *H05K 1/117* (2013.01); *H05K 3/325* (2013.01)

(58) Field of Classification Search
CPC ............... H01R 12/53; H01R 13/6589; H01R 13/6594; H01R 24/60; H05K 3/325; H05K 1/117
See application file for complete search history.

(56) References Cited

U.S. PATENT DOCUMENTS

| | | | | |
|---|---|---|---|---|
| 2014/0349496 | A1* | 11/2014 | Zhu ................ | H05K 1/0219 439/108 |
| 2019/0140374 | A1* | 5/2019 | Wu ................. | H01R 4/027 |
| 2019/0260165 | A1* | 8/2019 | Below ............. | H01R 13/6594 |
| 2020/0036117 | A1* | 1/2020 | Little .............. | H01R 12/62 |
| 2020/0194911 | A1* | 6/2020 | Ayzenberg ....... | H01R 13/6592 |

* cited by examiner

*Primary Examiner* — Tho D Ta
(74) *Attorney, Agent, or Firm* — Alston & Bird LLP (57) ABSTRACT

A connector backshell for accommodating and protecting rows of twisted pairs of cables is provided. The backshell includes four sidewalls and a printed circuit board (PCB) with a first group of conductive pads printed on the top side of the PCB and located at the rear side of the PCB, for receiving rows of corresponding wires of insulated cables, to be connected to the conductive pads, such that one row is located below the PCB and the other rows are located on top of each other above the top surface of the PCB. A second group of conductive pads are printed on the bottom side of the PCB and located at the rear side of the PCB, for receiving corresponding wires of insulated cables, to be connected to the conductive pads, such that at least one row is located below the PCB.

10 Claims, 10 Drawing Sheets

QSFP-DD CONNECTOR BACKSHELL WITH VERTICALLY ARRANGED ROWS OF CABLES

TECHNOLOGICAL FIELD

The present invention relates to the field of electric connectors. More particularly, the invention relates to a space-efficient Quad Small Form-factor Pluggable Double Density (QSFP-DD) copper cable backshell design, that allows inserting 4 rows of twisted pairs of cables.

BACKGROUND

A connector backshell is the ending connector of a cable and is the housing designed at the form factor to ensure mating with the counterpart connector of the system. The backshell also is designed to protect the PCB and the connector and allows an area for soldering the bulk material and the PCB in the copper QSFP-DD form factor. Connector backshells are essential accessories that are threaded onto the rear of a circular or rectangular connector shell to provide additional support and protection. They may be used for shielding against electrical interference, mechanical injury, or physical damage due to environmental conditions.

Quad Small Form-factor Pluggable Double Density (QSFP-DD) connectors are standard connectors which comprises 16 twisted pairs of cables to form eight communication channels. A QSFD-DD copper cable is able to transfer data at a rate of 400 GBS or even at higher data rates; Higher gauges are required in order to reach higher lengths reliably, so gauges of 26 AWG are required. In order to achieve the full bandwidth, larger diameter conductors (higher cable gauge) must be used.

A standard QSFP-DD plug connector consists of a backshell and a Printed Circuit Board (PCB) with strict backshell dimensions, PCB thickness and location within the backshell, in order to comply with QSFP-DD specification (since the PCB is the connector's plug with contacts that should mate a counterpart connector's receptacle).

Figure 1:
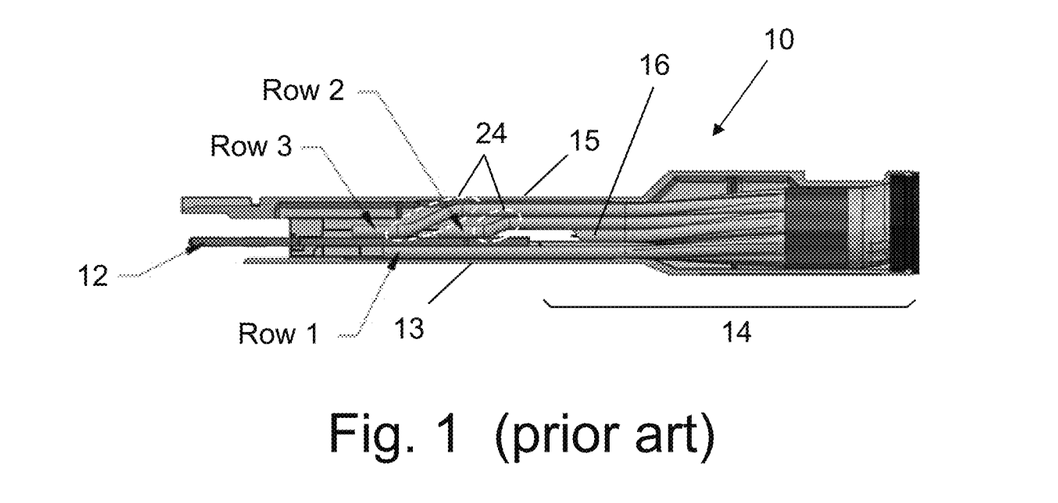
FIG. 1 (prior art) illustrates a cross-sectional view of a standard QSFP-DD plug connector 10, with the limitation of inserting more than 3 rows 11a-11c of twisted pairs of cables with gauges higher than 27 AWG.

FIG. 1 (prior art) illustrates a cross-sectional view of a standard QSFP-DD plug connector 10, which does not allow inserting more than 3 rows 11a-11c of twisted pairs of AWG 26 cables with gauges higher than 27 AWG. The spacing between the bottom side of the PCB 12 and the lower sidewall 13 of the backshell 14 allows inserting only a first row (Row1) of twisted pairs of cables with gauges higher (thicker) than 27 AWG, which is connected to the bottom side (printed side) of PCB 12. The spacing between the top side of the PCB 12 and the higher sidewall 15 of the backshell 14 allows inserting only two rows (Row 1 and Row 2) of twisted pairs of cables with gauges higher than 27 AWG, which are connected to the top side (component side) of PCB 12. Each row ends at a line, along which 8 corresponding pads (on the top side of PCB 12) arranged in 4 pairs, are printed (will be shown later on). It can be seen that the vertical spacing constrains do not allow adding and connecting cables of a 4th row 16, unless the gauges of all cables is reduced (which is not acceptable due to the entailed degradation of performance regarding bandwidth and data rates).

Figure 2:
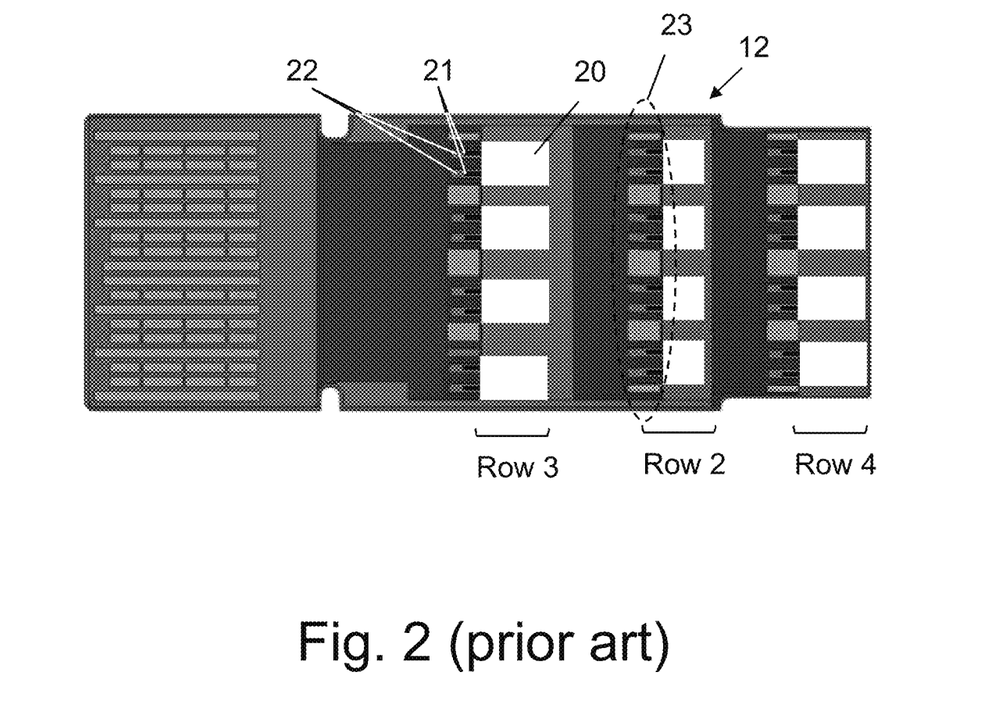
FIG. 2 (prior art) illustrates a design of the top side of PCB.

FIG. 2 (prior art) illustrates a design of the top side of PCB 12. It can be seen that each cable 20 in a row (e.g., Row 3) has two wires 21 that are connected (typically soldered) to two printed corresponding pads 22. Similar arrangement is implemented with respect to the cables of Row 2, while the set of printed pads 23 that corresponds to Row 2 is lateral displaced, in order to enable access of all 8 wires of Row 2 to their corresponding printed pads 23.

Looking again at FIG. 1, it is seen that the cables of Row 2 are located below the cables of Row 3, while the spacing between their corresponding printed pads 22 allows to perform double bending 24 of the cables of each row, in order to adjust the highest of the tip of each cable to the top surface of PCB 12, which is required for soldering wires to printed pads. Also, each double bending 24 occupies lateral space. However, inserting a $4^{th}$ row and connecting it to the PCB is not possible, since there is no sufficient space for it, because the thickness of the cable insulation sleeve exceeds the top surface of the PCB 12.

It is therefore an object of the present invention to provide a method and design adapted for inserting 4 rows of twisted pairs of cables into a vertical space limited by the size of the connector's backshell.

It is another object of the present invention to provide a method and design adapted for inserting 4 rows of twisted pairs of cables with gauges higher than 27 AWG into a vertical space limited by the size of the connector's backshell.

Other objects and advantages of the invention will become apparent as the description proceeds.

BRIEF SUMMARY

A method for inserting rows of twisted pairs of cables into a connector backshell (such as of a QSFP-DD connector), comprising the steps of:

a) providing a connector having a backshell consisting of:
   a.1) four sidewalls with predetermined spacing between any two opposing sidewalls;
   a.2) a PCB having a predetermined thickness and location with respect to the opposing walls that are parallel to the PCB, which comprises:
      a first group of conductive pads printed on the top side of the PCB and located at the rear side of the PCB, for receiving corresponding wires of insulated cables, to be connected to the conductive pads, the group consists of one or more subgroup, spaced from each other, for receiving wires of corresponding one or more rows, each of which having several insulated cables, such that one row is located below the PCB and the other rows are located on top of each other above the top surface of the PCB;
      a second group of conductive pads printed on the bottom side of the PCB and located at the rear side of the PCB, for receiving corresponding wires of insulated cables, to be connected to the conductive pads, the group consists of one or more subgroups for receiving corresponding one or more rows, each of several insulated cables, such that at least one row is located below the PCB;
      a third group of printed conductive pads located at the front side of the PCB, being the plug of the connector;
b) providing an additional subgroup of conductive pads along the rear edge of the PCB, for receiving an additional row of one or more insulated cables;
c) exposing the wires of the additional row by terminating their insulation sleeve along the rear edge of the PCB;
d) connecting the exposed the wires of the additional row such that the wires are overlapping, and aligned with, the conductive pads of the additional subgroup, while allowing the lower half of insulating sleeve to be located below the top surface of the PCB.

The edge of the insulated cables may be bended within the spacing between the PCB and the opposing sidewalls, for aligning their wires with the surface of the PCB.

In one aspect, the gauge of the insulated cables is higher than 27 AWG.

In one aspect, exposed wires of the insulated cables are connected to conductive pads by soldering.

In one aspect, each row comprises 4 insulated cables.

A fourth row may be an additional row of insulated cables.

A connector backshell for accommodating and protecting rows of twisted pairs of cables, which comprises:
  a) four sidewalls with predetermined spacing between any two opposing sidewalls;
  b) a PCB having a predetermined thickness and location with respect to the opposing walls being parallel to the PCB, which comprises:
    a first group of conductive pads printed on the top side of the PCB and located at the rear side of the PCB, for receiving corresponding wires of insulated cables, to be connected to the conductive pads, the group consisting of one or more subgroups, spaced from each other, for receiving wires of corresponding one or more rows, each of which having several insulated cables, such that one row is located below the PCB and the other rows are located on top of each other above the top surface of the PCB;
    a second group of conductive pads printed on the bottom side of the PCB and located at the rear side of the PCB, for receiving corresponding wires of insulated cables, to be connected to the conductive pads, the group consisting of one or more subgroups for receiving corresponding one or more rows, each of several insulated cables, such that at least one row is located below the PCB;
    a third group of printed conductive pads located at the front side of the PCB, being the plug of the connector;
  c) an additional subgroup of conductive pads printed along the rear edge of the PCB, for receiving an additional row of one or more insulated cables;
wherein the insulation sleeves of the cables of the additional row terminate along the rear edge of the PCB, for exposing the wires of the additional row, and the exposed wires of the additional row are connected such that they overlap, and align with, the conductive pads of the additional subgroup, while allowing the lower half of insulating sleeve to be located below the top surface of the PCB.

The PCB may further comprise an extension, the top surface of which is milled to a desired thickness to fill the gap between the cables of the additional row and the cables of other rows, for providing support to the insulating sleeve of each cable of the additional row.

The connector backshell may further comprise a spacer that fills the gap between the cables of the additional row and the cables of other rows, for providing support to the insulating sleeve of each cable of the additional row.

BRIEF DESCRIPTION OF THE DRAWINGS

The above and other characteristics and advantages of the invention will be better understood through the following illustrative and non-limitative detailed description of embodiments thereof, with reference to the appended drawings, wherein.

DETAILED DESCRIPTION

A space-efficient QSFP-DD copper cable backshell design is proposed. This novel design allows inserting 4 rows of twisted pairs of cables with gauges higher than 27 AWG. According to the proposed design, a $4^{th}$ row is added to the upper side of the PCB, such that the set of pads that correspond to the wires extending from the tip of each cable, is printed at the rear edge of the PCB 12, so that half of the diameter (or thickness) of each cable exceeds the top surface of the PCB, as will be explained in more details hereinafter.

Figure 3:
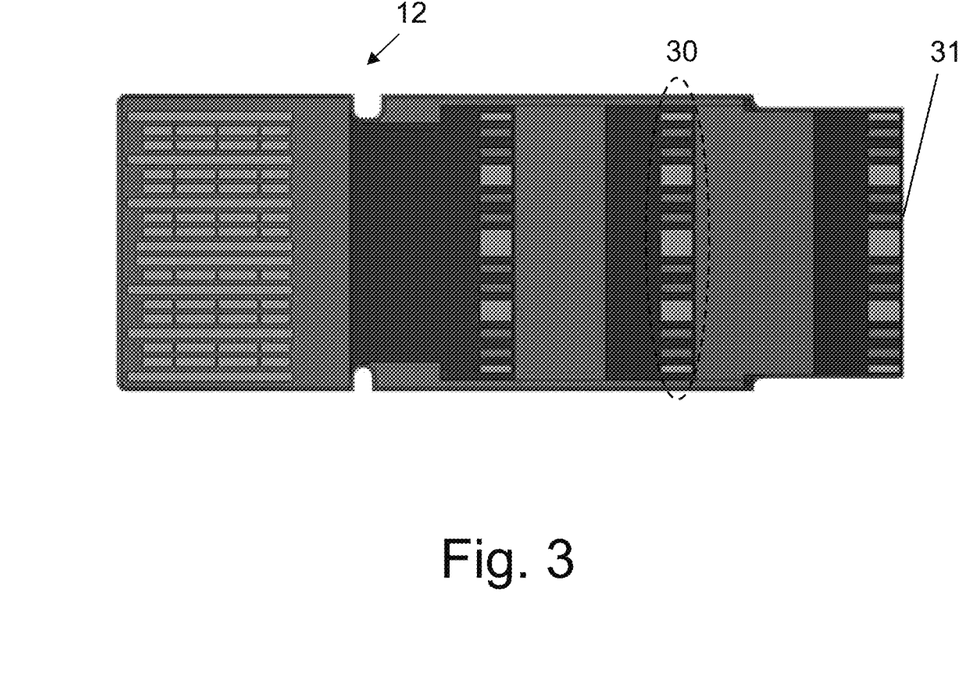
FIG. 3 illustrates a design of the top side of the PCB, such that the set of pads for the $4^{th}$ row is printed at the rear edge of the PCB, according to an embodiment of the invention.
Figure 4:
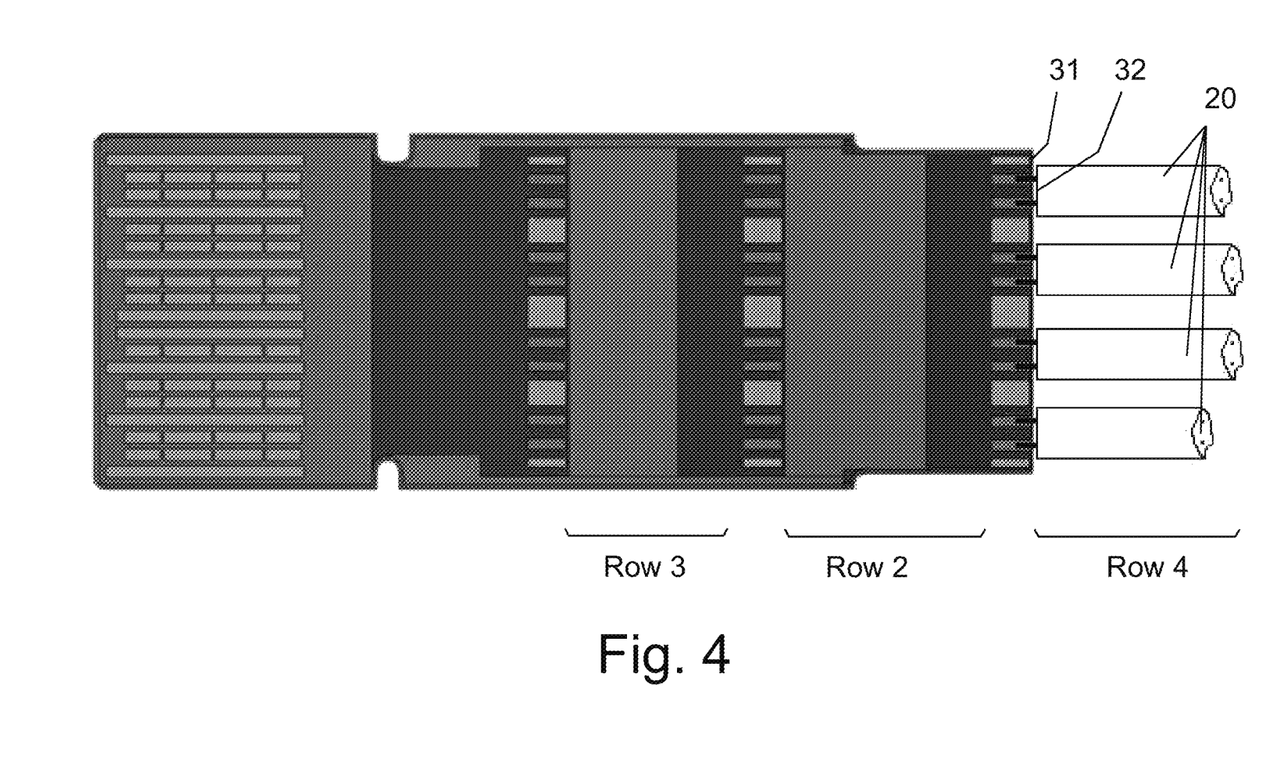
FIG. 4 is a top view of the PCB with the connections of cables of Row 4 to the set of pads printed at the rear edge of the PCB, according to an embodiment of the invention.

FIG. 3 illustrates a design of the top side of the PCB, such that the set of pads 30 for the $4^{th}$ row is printed at the read edge of the PCB 12, according to an embodiment of the invention. In this design, the cable insulation edge 32 (from which bare wires are extending) touches the rear edge 31 of the PCB 12, as shown in FIG. 4.

Figure 5A:
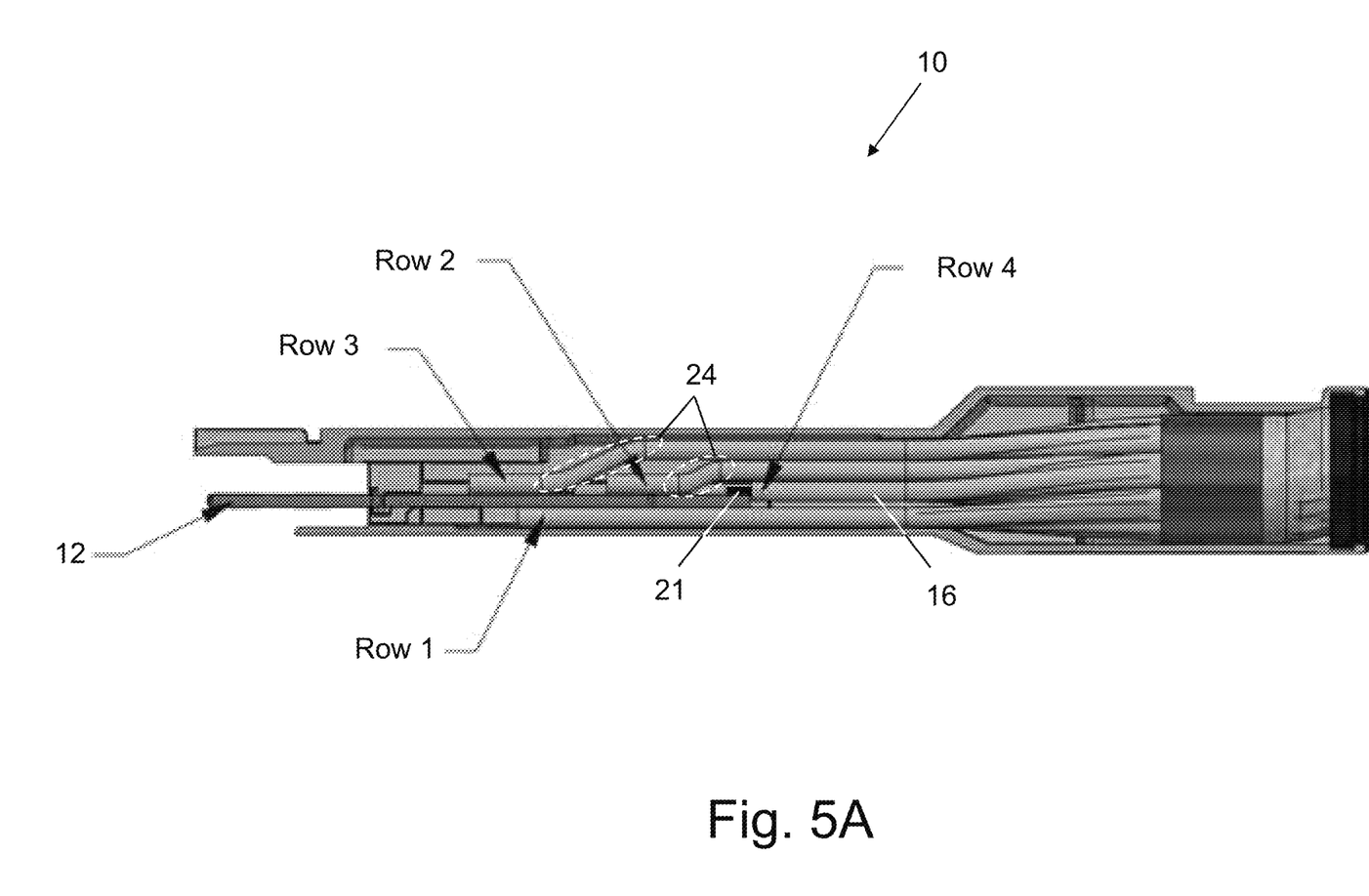
FIG. 5A shows a cross-sectional view of a standard QSFP-DD plug connector, with an additional row (Row 4) of twisted pairs of cables with gauges higher than 27 AWG, which is inserted below Row 2, according to an embodiment of the invention.

FIG. 5A shows a cross-sectional view of a standard QSFP-DD plug connector 10, with an additional row (Row 4) of twisted pairs of cables with gauges higher than 27 AWG, which is inserted below Row 2, according to an embodiment of the invention. The insulating sleeve of each cable 16 of Row 4 ends with an insulation edge 30 (from which bare wires 21 are extending) touches the rear edge 31 of the PCB 12, such that part of the insulating sleeve is located below the top surface of PCB 12.

Figure 5B:
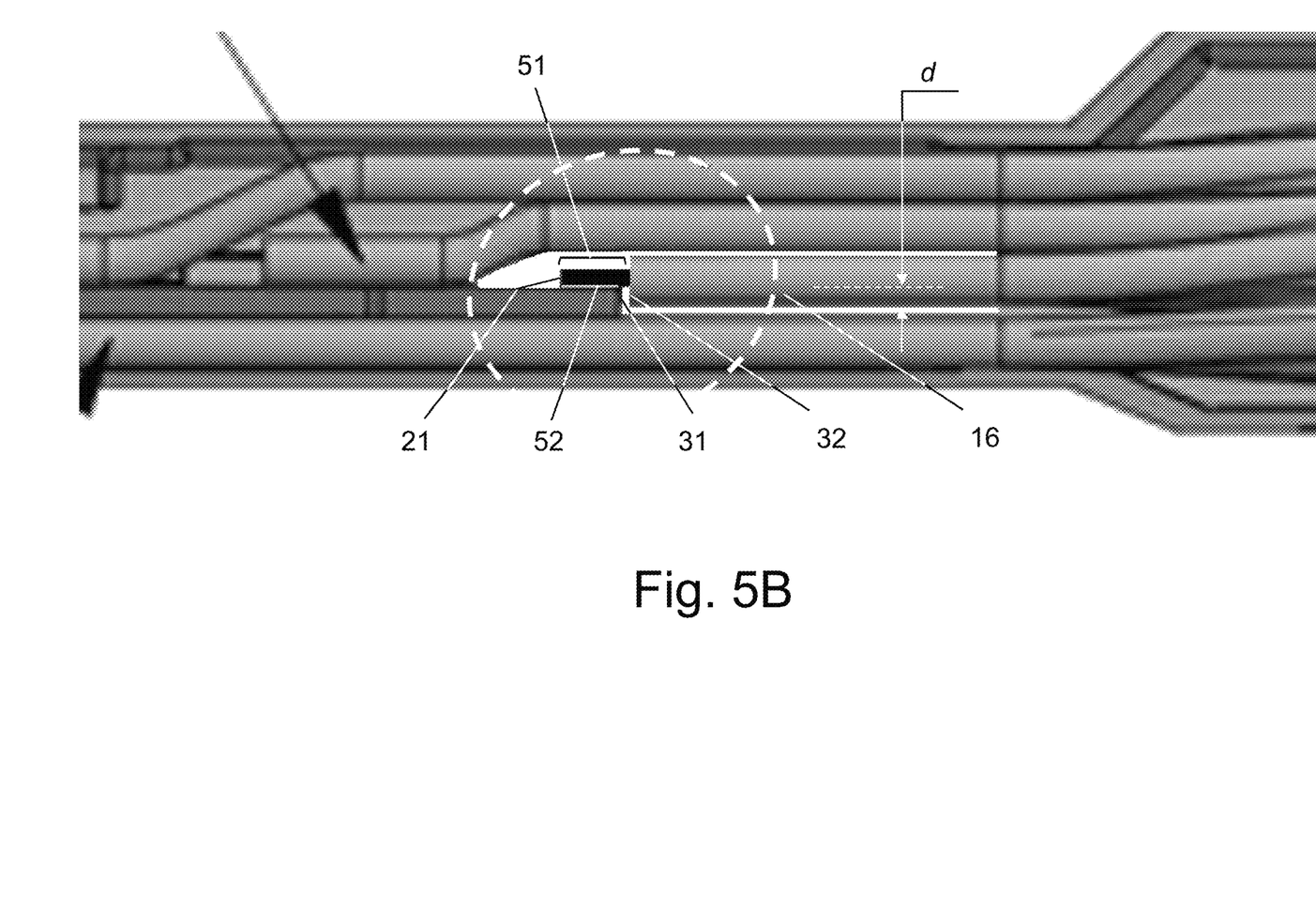
FIG. 5B is a detailed view of connecting the additional row (Row 4) shown in FIG. 5A, according to an embodiment of the invention.

FIG. 5B is a detailed view illustrating the connection of the additional row (Row 4) shown in FIG. 5A, according to an embodiment of the invention. The insulating sleeve of each cable 16 of Row 4 ends with an insulation edge 30 (from which bare wires 21 extend) touches the rear edge 31 of the PCB 12. The exposed tip 51 of wire 21 is placed on printed conducting pad 52, to allow soldering (or any other type of connection to the PCB 12). It can be seen that according to the proposed design, the lower half of insulating sleeve thickness d (mm) is located below the top surface of PCB 12. This arrangement saves a vertical space of d mm. This saving allows increasing the gauge of the cable, while still allowing the insertion of Row 4 into the given (vertical) space.

Figure 6A:
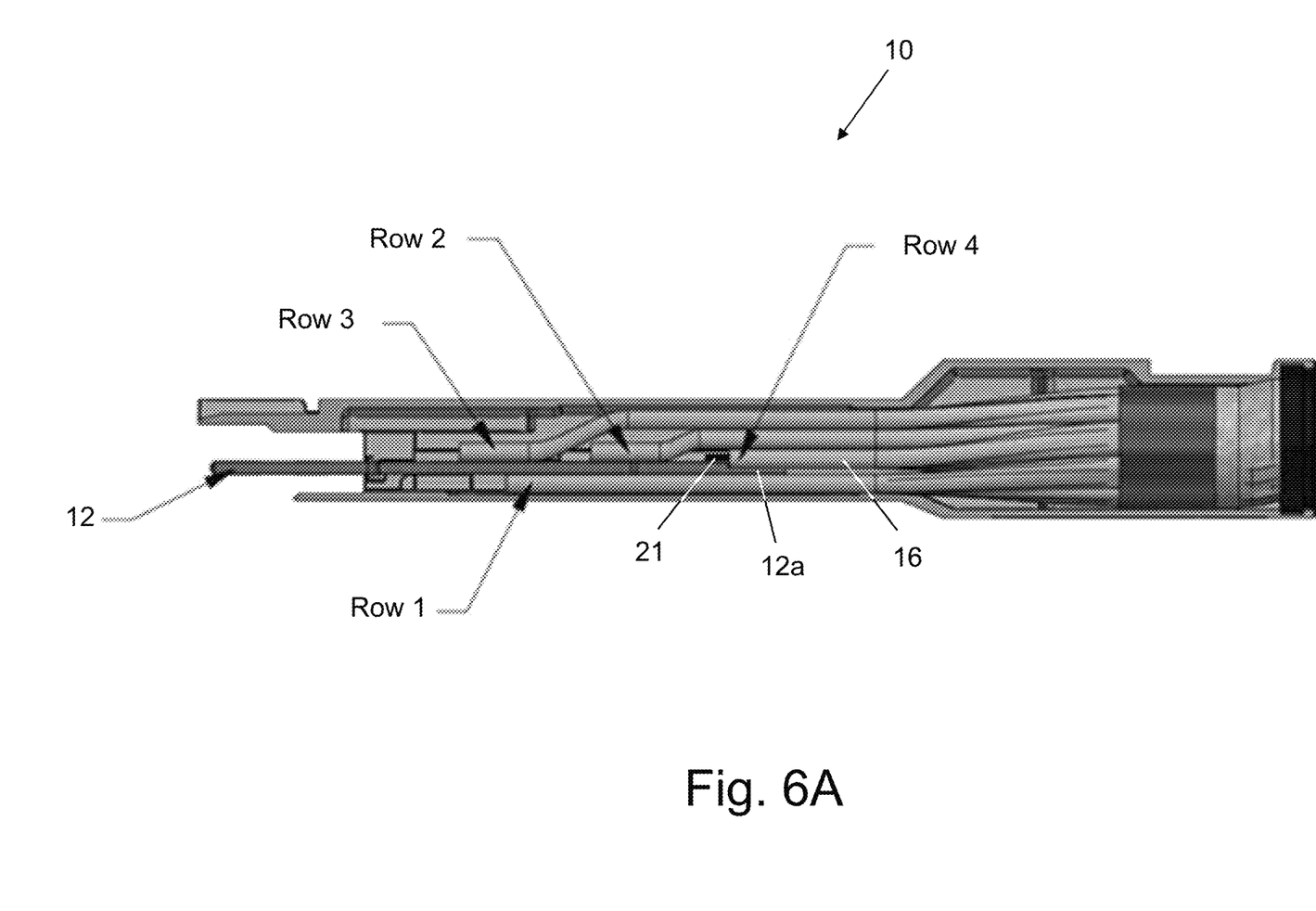
FIG. 6A shows a cross-sectional view of a standard QSFP-DD plug connector, with an additional row (Row 4) of twisted pairs of cables with a cable supported by a PCB, according to an embodiment of the invention.

FIG. 6A shows a cross-sectional view of a standard QSFP-DD plug connector 10, with an additional row (Row 4) of twisted pairs of cables with a cable support, according to an embodiment of the invention. In this embodiment, the PCB 12 includes an extension 12a, the top surface of which is milled to a desired thickness to fill the gap between the cables of Row 4 and the cable of Row 1, to provide support to the insulating sleeve of each cable 16 of Row 4 during the soldering process.

Figure 6B:
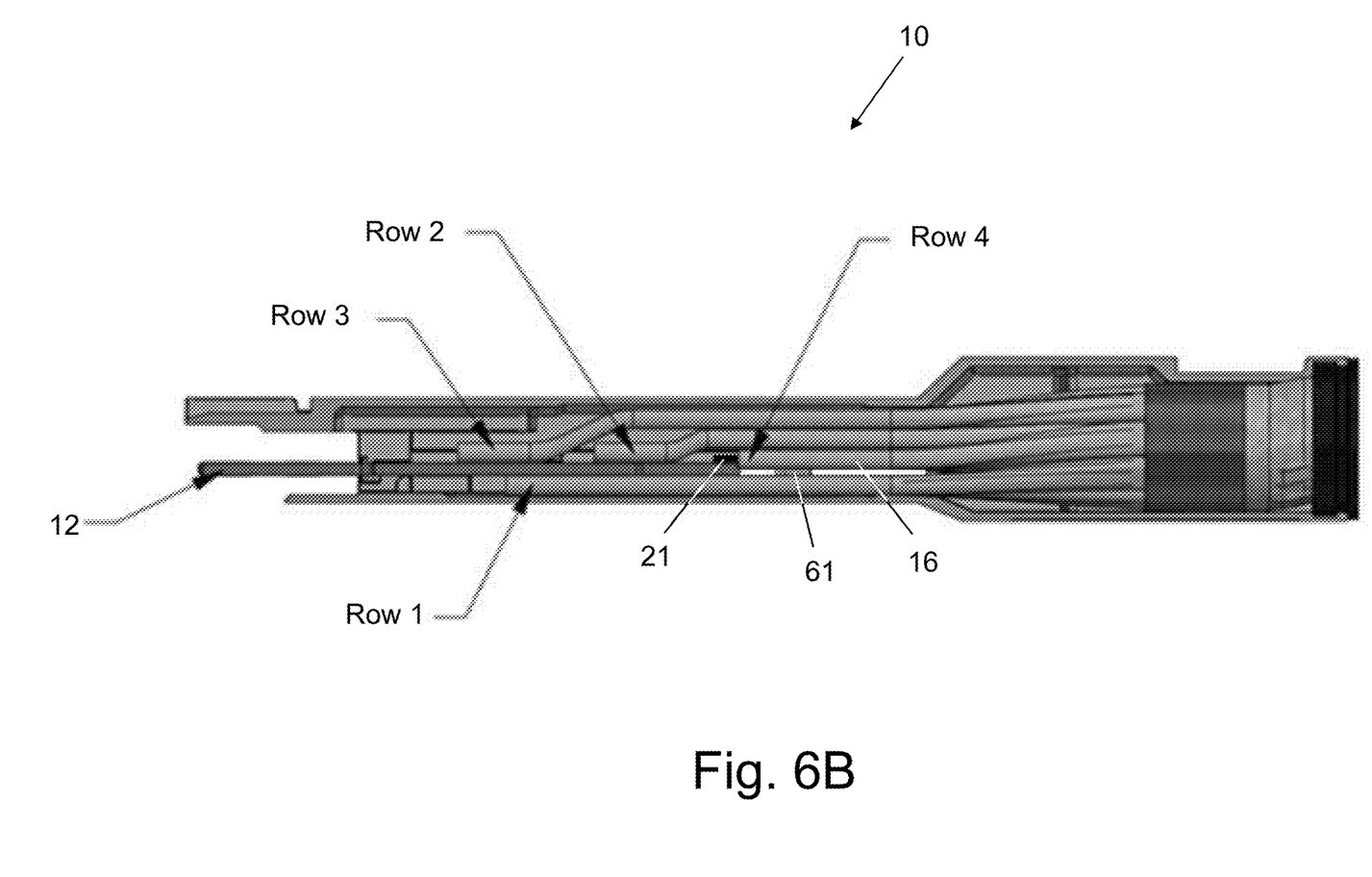
FIG. 6B shows a cross-sectional view of a standard QSFP-DD plug connector, with an additional row (Row 4) of twisted pairs of cables with a cable supported by an additional part in the assembly, according to another embodiment of the invention.

FIG. 6B shows a cross-sectional view of a standard QSFP-DD plug connector 10, with an additional row (Row 4) of twisted pairs of cables with a cable support, according to another embodiment of the invention. In this embodiment, instead of using a milled extension of PCB 12, the gap between the cables of Row 4 and the cable of Row 1 is filled with a spacer 61, to provide support to the insulating sleeve of each cable 16 of Row 4 during the soldering process.

Figure 7A:
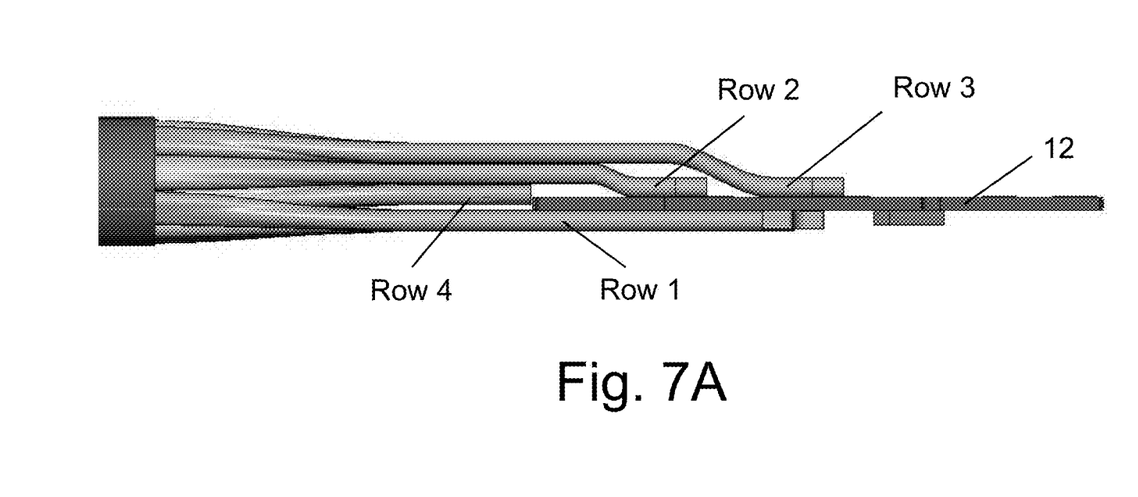
FIG. 7A shows a side view of the arrangement and connection of 4 rows for a standard QSFP-DD plug connector to the PCB, according to an embodiment of the invention.

FIG. 7A shows a side view of the arrangement and connection of 4 rows for a standard QSFP-DD plug connector 10 to the PCB, according to an embodiment of the invention. It can be seen that Row 4 is connected to pads at the rear edge of PCB 12.

Figure 7B:
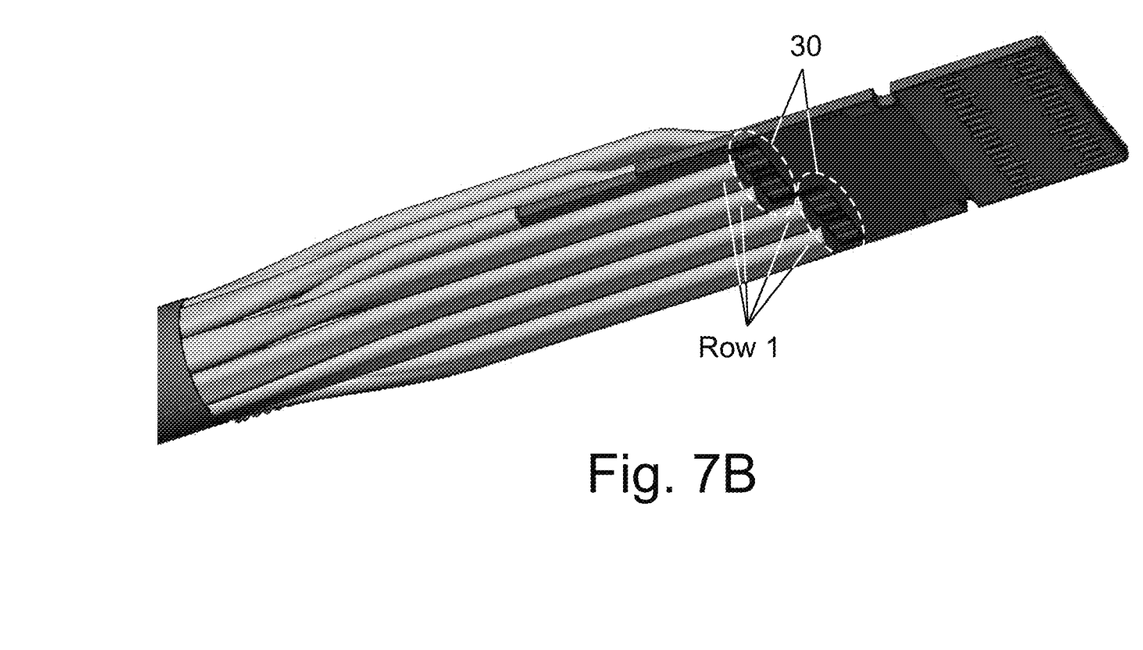
FIG. 7B shows a perspective view of the arrangement and connection of Row 1 for a standard QSFP-DD plug connector to the PCB, according to an embodiment of the invention.

FIG. 7B shows a perspective view of the arrangement and connection of Row 1 for a standard QSFP-DD plug connector 10 to the PCB, according to an embodiment of the invention. It can be seen that the 4 cables of Row 1 are connected to corresponding pads 30 at the bottom side of PCB 12.

Figure 7C:
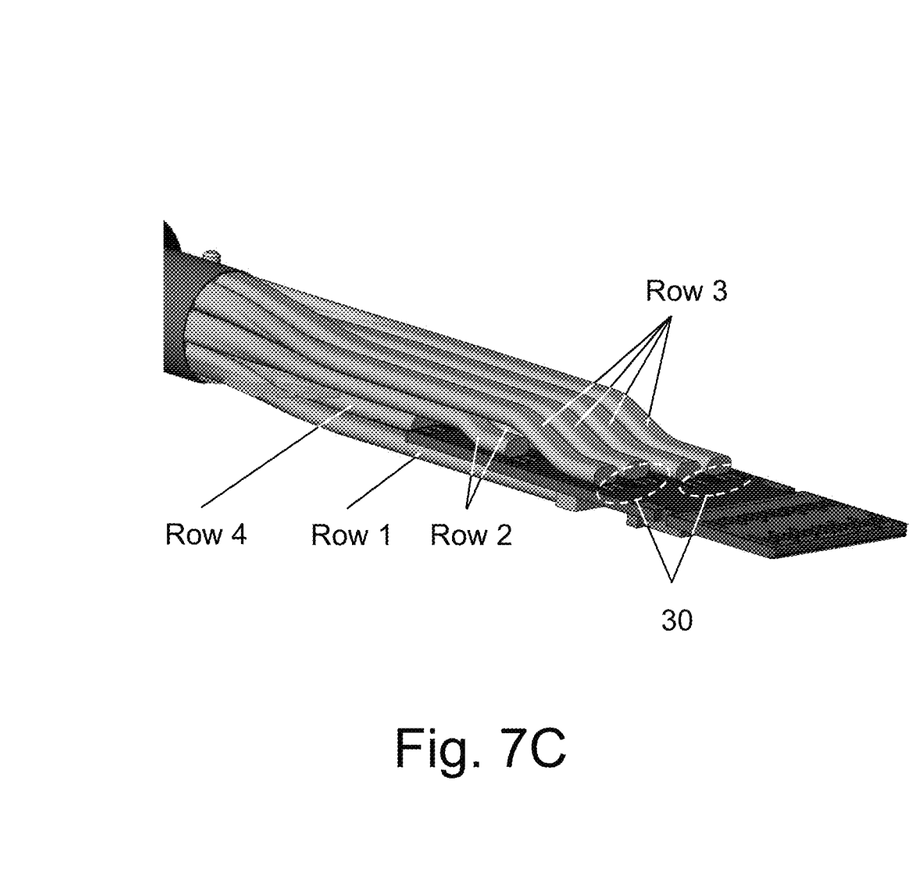
FIG. 7C shows a perspective view of the arrangement and connection of Rows 1-4 for a standard QSFP-DD plug connector to the PCB, according to an embodiment of the invention.

FIG. 7C shows a perspective view of the arrangement and connection of Rows 1-4 for a standard QSFP-DD plug connector 10 to the PCB, according to an embodiment of the invention. It can be seen that the 4 cables of Row 3 are connected to corresponding pads 30 at the top side of PCB 12, using bending. Similar connections are implemented with respect to Row 2. Row 4 is connected directly, with no need for bending.

The above examples and description have of course been provided only for the purpose of illustrations and are not intended to limit the invention in any way. As will be appreciated by the skilled person, the invention can be carried out in a great variety of ways, employing more than one technique from those described above, all without exceeding the scope of the invention.

The invention claimed is:

1. A method for inserting rows of pairs insulated of cables into a connector backshell, the method comprising:
   a) providing a connector having a backshell consisting of:
      a.1) four sidewalls with predetermined spacing between any two opposing sidewalls;
      a.2) a PCB having a predetermined thickness and location with respect to the opposing sidewalls that are parallel to said PCB, which comprises:
         a first group of conductive pads printed on a top surface of said PCB and located at a rear side of said PCB, for receiving corresponding wires of said insulated cables, to be connected to said conductive pads, said first group consists of one or more subgroup, spaced from each other, for receiving the corresponding wires of corresponding one or more rows, each of which having several of said insulated cables, such that one row is located below said PCB and the other rows are located on top of each other above the top surface of said PCB;
         a second group of conductive pads printed on a bottom surface of said PCB and located at the rear side of said PCB, for receiving corresponding wires of said insulated cables, to be connected to said second group of conductive pads, said second group consists of one or more subgroups for receiving the corresponding wires of corresponding one or more rows, each of which having several of said insulated cables, such that at least one row is located below the bottom surface of said PCB;
         a third group of printed conductive pads located at the front side of said PCB, being a plug of said connector;
   b) providing an additional subgroup of conductive pads on the top surface of said PCB along the rear edge of said PCB, for receiving an additional row of one or more of said insulated cables;
   c) exposing wires of said additional row by terminating their insulation sleeve along the rear edge of said PCB;
   d) connecting exposed wires of said additional row such that said exposed wires are overlapping, and aligned with, the conductive pads of said additional subgroup, while allowing a part of each of the insulating sleeve to be located below the top surface of said PCB.

2. A method according to claim 1, wherein the backshell belongs to a QSFP-DD connector.

3. A method according to claim 1, wherein an edge of each of the insulated cables are bended within the spacing between the PCB and the opposing sidewalls, for aligning their wires with the top surface of said PCB.

4. A method according to claim 1, wherein the gauge of the insulated cables is higher than 27 AWG.

5. A method according to claim 1, wherein the exposed wires of the insulated cables are connected to the conductive pads by soldering.

6. A method according to claim 1, wherein each row comprises four pairs of insulated cables.

7. A method according to claim 2, wherein the additional row of the insulated cables is a fourth row.

8. A connector backshell for accommodating and protecting rows of pairs of insulated cables, the connector backshell comprising:
   a) four sidewalls with predetermined spacing between any two opposing sidewalls;
   b) a PCB having a predetermined thickness and location with respect to the opposing walls being parallel to said PCB, which comprises:
      a first group of conductive pads printed on a top surface of said PCB and located at a rear side of said PCB, for receiving corresponding wires of said insulated cables, to be connected to said conductive pads, said first group consisting of one or more subgroups, spaced from each other, for receiving the corresponding wires of corresponding one or more rows, each of which having several of said insulated cables, such that one row is located below said PCB and the other rows are located on top of each other above the top surface of said PCB;

a second group of conductive pads printed on a bottom surface of said PCB and located at the rear side of said PCB, for receiving corresponding wires of said insulated cables, to be connected to said second group of conductive pads, said second group consisting of one or more subgroups for receiving the corresponding wires of corresponding one or more rows, each of which having several of said insulated cables, such that at least one row is located below the bottom surface of said PCB;

a third group of printed conductive pads located at a front side of said PCB, being a plug of said connector;

an additional subgroup of conductive pads printed on the top surface of said PCB along the rear edge of said PCB, for receiving an additional row of one or more of said insulated cables;

wherein insulation sleeves of the insulated cables of said additional row terminate along the rear edge of said PCB, for exposing wires of said additional row, and the exposed wires of said additional row are connected such that they overlap, and align with, the conductive pads of said additional subgroup, while allowing a part of each of the insulating sleeve to be located below the top surface of said PCB.

9. A connector backshell according to claim 8, in which the PCB further comprises an extension, the top surface of which is milled to a desired thickness to fill the gap between the insulated cables of the additional row and the insulated cables of other rows, for providing support to the insulating sleeve of each insulated cable of said additional row.

10. A connector backshell according to claim 8, further comprising a spacer that fills the gap between the insulated cables of the additional row and the insulated cables of other rows, for providing support to the insulating sleeve of each insulated cable of said additional row.

* * * * *

UNITED STATES PATENT AND TRADEMARK OFFICE
CERTIFICATE OF CORRECTION

PATENT NO. : 10,916,877 B1
APPLICATION NO. : 16/688145
DATED : February 9, 2021
INVENTOR(S) : Khazen et al.

Page 1 of 1

It is certified that error appears in the above-identified patent and that said Letters Patent is hereby corrected as shown below:

In the Claims

Column 6,
Line 33, "d) connecting exposed wires" should read --d) connecting the exposed wires--.

Signed and Sealed this
Twentieth Day of April, 2021

Drew Hirshfeld
*Performing the Functions and Duties of the
Under Secretary of Commerce for Intellectual Property and
Director of the United States Patent and Trademark Office*